United States Patent
Sun et al.

(10) Patent No.: US 12,315,083 B2
(45) Date of Patent: May 27, 2025

(54) PERFORMING POINT CLOUD TASKS USING MULTI-SCALE FEATURES GENERATED THROUGH SELF-ATTENTION

(71) Applicant: Waymo LLC, Mountain View, CA (US)

(72) Inventors: Pei Sun, Palo Alto, CA (US); Mingxing Tan, Newark, CA (US); Weiyue Wang, Sunnyvale, CA (US); Fei Xia, Sunnyvale, CA (US); Zhaoqi Leng, Milpitas, CA (US); Dragomir Anguelov, San Francisco, CA (US); Chenxi Liu, Santa Clara, CA (US)

(73) Assignee: Waymo LLC, Mountain View, CA (US)

( * ) Notice: Subject to any disclaimer, the term of this patent is extended or adjusted under 35 U.S.C. 154(b) by 169 days.

(21) Appl. No.: 18/120,989

(22) Filed: Mar. 13, 2023

(65) Prior Publication Data
US 2023/0351691 A1    Nov. 2, 2023

Related U.S. Application Data

(60) Provisional application No. 63/323,914, filed on Mar. 25, 2022, provisional application No. 63/319,228, filed on Mar. 11, 2022.

(51) Int. Cl.
*G06T 17/20* (2006.01)
*G06F 30/27* (2020.01)
(Continued)

(52) U.S. Cl.
CPC .............. *G06T 17/20* (2013.01); *G06F 30/27* (2020.01); *G06T 5/60* (2024.01); *G06T 15/20* (2013.01); *G06T 17/05* (2013.01); *G06T 2210/56* (2013.01)

(58) Field of Classification Search
CPC ......... G06T 17/20; G06T 17/00; G06T 17/05; G06T 15/00; G06T 15/20; G06T 5/60;
(Continued)

(56) References Cited

U.S. PATENT DOCUMENTS 10,970,518 B1 * 4/2021 Zhou ...................... G06T 9/002
11,100,669 B1 * 8/2021 Zhou ..................... G01S 13/867
(Continued)

OTHER PUBLICATIONS

Bello et al., "Attention augmented convolutional networks," Proceedings of the IEEE/CVF International Conference on Computer Vision (ICCV). 2019, pp. 3286-3295.
(Continued)

*Primary Examiner* — Vijay Shankar
(74) *Attorney, Agent, or Firm* — Fish & Richardson P.C.

(57) ABSTRACT

Methods, systems, and apparatus for processing point clouds using neural networks to perform a machine learning task. In one aspect, a system comprises one or more computers configured to obtain a set of point clouds captured by one or more sensors. Each point cloud includes a respective plurality of three-dimensional points. The one or more computers assign the three-dimensional points to respective voxels in a voxel grid, where the grid of voxels includes non-empty voxels to which one or more points are assigned and empty voxels to which no points are assigned. For each non-empty voxel, the one or more computers generate initial features based on the points that are assigned to the non-empty voxel. The one or more computers generate multi-scale features of the voxel grid, and the one or more computers generate an output for a point cloud processing task using the multi-scale features of the voxel grid.

20 Claims, 5 Drawing Sheets

(51) Int. Cl.
 G06T 5/60 (2024.01)
 G06T 15/20 (2011.01)
 G06T 17/05 (2011.01)
(58) Field of Classification Search
 CPC ....... G06T 2207/20084; G06T 2210/56; G06F 30/27
 See application file for complete search history.

(56) References Cited

U.S. PATENT DOCUMENTS

| | | | | |
|---|---|---|---|---|
| 2021/0335031 | A1* | 10/2021 | Hamilton | G06T 15/06 |
| 2021/0350620 | A1* | 11/2021 | Bronstein | G06N 20/00 |
| 2023/0316642 | A1* | 10/2023 | Mory | G06T 15/08 345/418 |
| 2024/0282051 | A1* | 8/2024 | Roimela | G06V 10/761 |

OTHER PUBLICATIONS

Bewley et al., "Range conditioned dilated convolutions for scale invariant 3D object detection," CoRR, May 20, 2020, arxiv.org/pdf/2005.09927, 16 pages.
Carion et al., "End-to-end object detection with transformers," European conference on computer vision, Nov. 3, 2020, pp. 213-229.
Chai et al., "To the point: Efficient 3Dobject detection in the range image with graph convolution kernels," Proceedings of the IEEE/CVF Conference on Computer Vision and Pattern Recognition, 2021, pp. 16000-16009.
Cheng et al., "Improving 3D object detection through progressive population based augmentation," European Conference on Computer Vision, Nov. 12, 2020, pp. 279-294.
Dai et al., "CoAtNnet: Marrying convolution and attention for all data sizes," Advances in Neural Information Processing Systems 34, 2021, 13 pages.
Devlin et al., "BERT: Pre-training of deep bidirectional transformers for language understanding," CoRR, Oct. 11, 2018, arXiv:1810.04805, 16 pages.
Dosovitskiy et al., "An image is worth 16×16 words: Transformers for image recognition at scale," CoRR, Oct. 22, 2020, arXiv:2010.11929, 22 pages.
Engel et al., "Point transformer," IEEE Access, Sep. 29, 2021, 9:134826-134840.
Fan et al., "Embracing single stride 3D object detector with sparse transformer," CoRR, Dec. 13, 2021, arXiv:2112.06375, 14 pages.
Fan et al., "Rangedet: In defense of range view for lidar-based 3D object detection," Proceedings of the IEEE/CVF International Conference on Computer Vision (ICCV), 2021, pp. 2918-2927.
Ge et al., "AFDet: Anchor free one stage 3d object detection," CoRR, Jun. 23, 2020, arXiv:2006.12671, 10 pages.
Graham et al., "Submanifold sparse convolutional networks," CoRR, Jun. 5, 2017, arXiv:1706.01307, 10 pages.
Guizilini et al., "3D packing for self supervised monocular depth estimation," Proceedings of the IEEE/CVF Conference on Computer Vision and Pattern Recognition (CVPR), 2020, pp. 2485-2494.
Huang et al., "Deep networks with stochastic depth," European Conference on Computer Vision, Sep. 17, 2016, pp. 646-661.
Kingma et al., "Adam: A method for stochastic optimization," CoRR, Dec. 22, 2014, arXiv:1412.6980, 15 pages.
Lang et al., "Pointpillars: Fast encoders for object detection from point clouds," Proceedings of the IEEE/CVF Conference on Computer Vision and Pattern Recognition (CVPR), 2019, pp. 12697-12705.
Law et al., "Cornernet: Detecting objects as paired keypoints," Proceedings of the European Conference on Computer Vision (ECCV), 2018, pp. 734-750.
Lin et al., "Feature pyramid networks for object detection," Proceedings of the IEEE Conference on Computer Vision and Pattern Recognition (CVPR), 2017, pp. 2117-2125.
Lin et al., "Focal loss for dense object detection," Proceedings of the IEEE International Conference on Computer Vision (ICCV), 2017, pp. 2980-2988.
Liu et al., "Swin transformer: Hierarchical vision transformer using shifted windows," Proceedings of the IEEE/CVF International Conference on Computer Vision (ICCV), 2021, pp. 10012-10022.
Mao et al., "Voxel transformer for 3D object detection," Proceedings of the IEEE/CVF International Conference on Computer Vision, 2021, pp. 3164-3173.
Meyer et al., "Lasernet: An efficient probabilistic 3D object detector for autonomous driving," Proceedings of the IEEE/CVF Conference on Computer Vision and Pattern Recognition, 2019, pp. 12677-12686.
Misra et al., "An end-to-end transformer model for 3D object detection," Proceedings of the IEEE/CVF International Conference on Computer Vision, 2021, pp. 2906-2917.
Ngiam et al., "Starnet: Targeted computation for object detection in point clouds," CoRR, Aug. 29, 2019, arXiv:1908.11069, 12 pages.
Pan et al., "3D object detection with pointformer," Proceedings of the IEEE/CVF Conference on Computer Vision and Pattern Recognition, 2021, pp. 7463-7472.
Qi et al., "PointNet: Deep learning on point sets for 3D classification and segmentation," Proceedings of the IEEE Conference on Computer Vision and Pattern Recognition, 2017, pp. 652-660.
Qi et al., "Onboard 3D object detection from point cloud sequences," Proceedings of the IEEE/CVF Conference on Computer Vision and Pattern Recognition, 2021, pp. 6134-6144.
Qi et al., "Pointnet++: Deep hierarchical feature learning on point sets in a metric space," Advances in Neural Information Processing Systems 30, 2017, 10 pages.
Ramachandran et al., "Stand-alone self-attention in vision models," 33rd Conference on Neural Information Processing Systems, 2019, 13 pages.
Ren et al., "Faster R-CNN: Towards real-time object detection with region proposal networks," IEEE Transactions on Pattern Analysis and Machine Intelligence, Jun. 2017, 39(6):1137-1149.
Sabne, "XLA: Compiling machine learning for peak performance," Google Research, 2020, 1 pages (abstract only).
Shi et al., "PV-RCNN: Point-voxel feature set abstraction for 3D object detection," Proceedings of the IEEE/CVF Conference on Computer Vision and Pattern Recognition, 2020, pp. 10529-10538.
Shi et al., "PointRCNN: 3D object proposal generation and detection from point cloud," Proceedings of the IEEE/CVF Conference on Computer Vision and Pattern Recognition, 2019, pp. 770-779.
Sun et al., "Scalability in perception for autonomous driving: Waymo open dataset," Proceedings of the IEEE/CVF Conference on Computer Vision and Pattern Recognition, 2020, pp. 2446-2454.
Sun et al., "RSN: Range sparse net for efficient, accurate LiDAR 3D object detection," Proceedings of the IEEE/CVF Conference on Computer Vision and Pattern Recognition, 2021, pp. 5725-5734.
Vaswani et al., "Attention is all you need," lAdvances in Neural Information Processing Systems 30, 2017, 11 pages.
Wang et al., "Non-local neural networks," Proceedings of the IEEE Conference on Computer Vision and Pattern Recognition, 2018, pp. 7794-7803.
Wang et al., "Pillar-based object detection for autonomous driving," European Conference on Computer Vision, Nov. 17, 2020, 18 pages.
Waymo.com [online], "Introducing the 5th-generation Waymo Driver: Informed by experience, designed for scale, engineered to tackle more environments," Mar. 4, 2020, retrieved on Dec. 5, 2023, retrieved from URL<https://waymo.com/blog/2020/03/introducing-5th-generation-waymo-driver.html/>, 7 pages.
Yan et al., "Second: Sparsely embedded convolutional detection," Sensors, Oct. 6, 2018, 18(10):3337.
Yin et al., "Center-based 3D object detection and tracking," Proceedings of the IEEE/CVF Conference on Computer Vision and Pattern Recognition, 2021, pp. 11784-11793.

(56) References Cited

OTHER PUBLICATIONS

Zhao et al., "Point transformer," Proceedings of the IEEE/CVF International Conference on Computer Vision, 2021, pp. 16259-16268.
Zhou et al., "IoU loss for 2D/3D object detection," 2019 International Conference on 3D Vision, Sep. 16-19, 2019, 10 pages.
Zhou et al., "Objects as points," CoRR, Apr. 16, 2019, arXiv:1904.07850, 12 pages.
Zhou et al., "End-to-end multi-view fusion for 3D object detection in LiDAR point clouds," Proceedings of the Conference on Robot Learning, 2020, 100:923-932.
Zhou et al., "Voxelnet: End-to-end learning for point cloud based 3D object detection," Proceedings of the IEEE Conference on Computer Vision and Pattern Recognition, 2018, pp. 4490-4499.

* cited by examiner

PERFORMING POINT CLOUD TASKS USING MULTI-SCALE FEATURES GENERATED THROUGH SELF-ATTENTION

CROSS-REFERENCE TO RELATED APPLICATIONS

This application claims the benefit of U.S. Provisional Patent Application No. 63/319,228, filed on Mar. 11, 2022, and claims the benefit of U.S. Provisional Patent Application No. 63/323,914, filed on Mar. 25, 2022. The contents of the prior applications are considered part of and are hereby incorporated by reference.

BACKGROUND

This specification relates to processing point clouds using neural networks to perform a machine learning task.

Effectively processing point clouds in an environment is a task required for motion planning, e.g., by an autonomous vehicle.

Autonomous vehicles include self-driving cars, boats, and aircraft. Autonomous vehicles use a variety of on-board sensors and computer systems to detect nearby objects and use such detections to make control and navigation decisions.

BRIEF DESCRIPTION OF THE DRAWINGS

Like reference numbers and designations in the various drawings indicate like elements.

DETAILED DESCRIPTION

This specification describes a system implemented as computer programs on one or more computers in one or more locations that performs a point cloud processing task on a set of one or more point clouds.

The point cloud processing task can be any appropriate task that relates to objects that can be measured by the point clouds.

Autonomous vehicles can use on-board systems to capture point clouds representing scenes in an environment and to process the point clouds in order perform a point cloud processing task, such as 3D object detection. To perform the task, the systems generally process the point clouds by using trained neural networks.

However, processing the point clouds to generate accurate predictions is difficult due to the sparse nature of points in a point cloud as a 3D representation of a scene in the environment. Additionally, the on-board systems may be unable to process a relatively large amount of points as the scaling of point cloud sensing increases, e.g., as the size of a point cloud frame and the size of a point cloud sensing region increase.

Some existing techniques attempt to mitigate these issues by dividing the sparse point cloud input into grids of fixed sizes to convert the sparse 3D representation to a denser 2D representation. However, converting the point clouds to a 2D representing can result in scaling difficulties as the number of points increase and the 2D representation becomes too dense to efficiently perform a point cloud processing task. Additionally, these techniques are associated with performing window-shifting procedures to process segments of the sparse point cloud as a window of the 2D representation, but performing multiple window-shifting procedures can be computationally expensive and can increase latency.

Some other techniques use small convolution kernels to process the sparse point cloud input. However, these techniques cannot connect features that are sparsely disconnected without performing normal sparse convolutions, which increases overhead in performing the point cloud processing task and limits the representation capacity and receptive field of features in the environment.

Existing techniques have also attempted to use voxel Transformer neural networks to process the sparse point cloud input by using voxelized representations. However, voxel transformer neural networks are associated with an irregular memory access pattern that can be computationally inefficient, causing difficulties in scaling to a larger amount of point cloud inputs.

In contrast, this specification describes a system that uses multiple sparse window-based Transformer (SWTransformer) neural networks in a hierarchical structure to generate multi-scale features. The multi-scale features include features for each voxels in a scaled voxel grid corresponding to a scale of multiple scales. The multi-scale features allow for the system to achieve large receptive fields due to the different scales and the different features for context information. Additionally, the SWTransformer neural networks use self-attention to generate the multi-scale features without the use of excessive window-shifting or convolutions, which can increase the efficiency of the system and allow for varying scaling of point clouds captured by the system.

Figure 1:
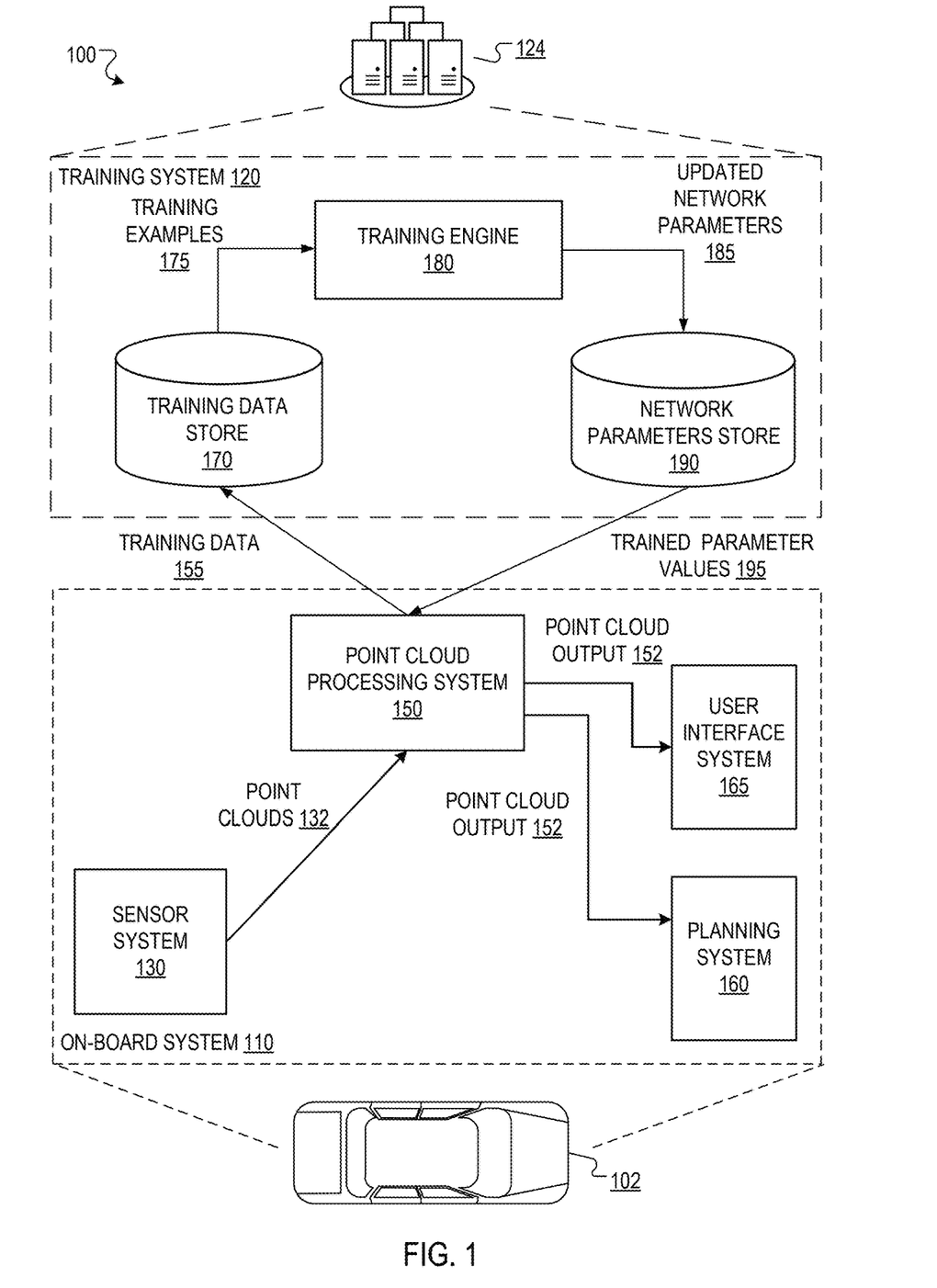
FIG. 1 is a block diagram of an example system.

FIG. 1 shows an example system 100. The system 100 includes an on-board system 110 and a training system 120.

The on-board system 110 is located on-board a vehicle 102. The vehicle 102 in FIG. 1 is illustrated as an automobile, but the on-board system 110 can be located on-board any appropriate vehicle type.

In some cases, the vehicle 102 is an autonomous vehicle. An autonomous vehicle can be a fully autonomous vehicle that determines and executes fully-autonomous driving decisions in order to navigate through an environment. An autonomous vehicle can also be a semi-autonomous vehicle that uses predictions to aid a human driver. For example, the vehicle 102 can autonomously apply the brakes if a prediction indicates that a human driver is about to collide with another vehicle. As another example, the vehicle 102 can have an advanced driver assistance system (ADAS) that assists a human driver of the vehicle 102 in driving the vehicle 102 by detecting potentially unsafe situations and alerting the human driver or otherwise responding to the unsafe situation. As a particular example, the vehicle 102 can alert the driver of the vehicle 102 or take an autonomous driving action when an obstacle is detected, when the vehicle departs from a driving lane, or when an object is detected in a blind spot of the human driver.

The on-board system 110 includes one or more sensor systems 130. The sensor systems 130 include sensors that generate point clouds, e.g., laser sensors that detect reflections of laser light. The sensor systems 130 can optionally also include additional sensors, e.g., camera sensors that deflect reflections of visible light, radar sensors that detect reflections of radio waves, and so on.

More specifically, a laser sensor, e.g., a Lidar sensor, or other sensor can transmit one or more pulses of electromagnetic radiation in a particular direction and can measure the intensity of any reflections as well as the time that the reflection was received. A distance can be computed by determining the time which elapses between transmitting a pulse and receiving its reflection. Each sensor can continually sweep a particular space in angle, azimuth, or both. Sweeping in azimuth, for example, can allow a sensor to detect multiple objects along the same line of sight.

As the vehicle 102 navigates through the environment, various sensors capture measurements of a scene in environment, e.g., the scene that is in the vicinity of the vehicle 102 at a given time point. For example, the lidar sensors can repeatedly capture sets of point clouds 132 during the navigation.

Each point cloud 132 in the set includes multiple three-dimensional (3D) points that represent a sensor measurement of the scene in an environment captured by one or more sensors.

When there are multiple point clouds 132 in the set, each point can be augmented with data that identifies the point cloud to which the respective point belongs, i.e., the corresponding point cloud of the respective point.

Once the sensor system 130 generates the point clouds 132, the sensor system 130 can send the point clouds 132 to a point cloud processing system 150, also on-board the vehicle 102.

The point cloud processing system 150 processes the point clouds 132 to generate a point cloud output for a point cloud processing task.

The point cloud processing system 150 generates multi-scale features using a Transformer-based neural network (e.g., a sparse window Transformer (SWFormer) neural network), and the point cloud processing system 150 processes the multi-scale features using a decoder neural network head to generate an output for the point cloud processing task, as described in further detail below with reference to FIGS. 2-5.

The point cloud processing system 150 can divide the environment represented by the point clouds 132 into a voxel grid. In particular, the point cloud processing system 150 assigns the points of each point cloud to respective voxels in the voxel grid by assigning each point to the voxel in the voxel grid that contains the point.

The voxel grid includes multiple voxels, where each voxel represents a volume of space in the environment. The voxel grid can be predetermined; that is, each voxel in the voxel grid can have a predetermined shape and size. For example, the voxel grid can be a Cartesian grid of the environment, where each voxel in the voxel grid represents cubic or cuboid voxels of a volume of space in the environment.

Once the point cloud processing system 150 has assigned the points to respective voxels in the voxel grid, the point cloud processing system 150 can determine whether each voxel is a non-empty voxel or an empty voxel. Non-empty voxels are voxels to which one or more points are assigned, and empty voxels to which no points are assigned.

The point cloud processing system 150 generates initial features for the non-empty voxels based on the points assigned to the non-empty voxel. The point cloud processing system 150 generates the initial features by performing sparse partitions of the voxels based on a scale of multiple scales. The scale refers to the size of the region corresponding to each voxel in the voxel grid.

The point cloud processing system processes the initial features to generate updated features using multiple sparse window Transformer (SWFormer) neural network blocks, as described in further detail below with reference to FIGS. 2 and 3. The SWFormer is a Transformer-based model that uses self-attention and window shifting to generate features of the point clouds 132.

The point cloud processing system 150 generates the multi-scale features of the voxel grid by fusing the generated features, as described in further detail with reference to FIGS. 2, 3, and 4. The multi-scale features are respective features for each non-empty voxel in a scaled voxel grid corresponding to each scale.

The point cloud processing system 150 then generates the point cloud output 152 for a point cloud processing task using the multi-scale features.

For example, the point cloud processing task can be a 3D object detection task and the point cloud output 152 can identify one or more 3D bounding boxes or other 3D regions within the point cloud(s) that are each measurements of a different object and, optionally, can identify an object class or object identifier for the object corresponding to each region.

As another example, the point cloud processing task can be a segmentation task and the point cloud output 152 can identify, for each point in the point cloud(s), an object category from a set of object categories to which the point belongs.

As yet another example, the point cloud processing task can be a motion prediction task and the point cloud output 152 can define (i) the predicted future motion of one or more of the points in the point cloud(s) or (ii) predicted future trajectories for one or more objects that are measured by regions of points in the point cloud(s).

The on-board system 110 also includes a planning system 160. The planning system 160 can make autonomous or semi-autonomous driving decisions for the vehicle 102, e.g., by generating a planned vehicle path that characterizes a path that the vehicle 102 will take in the future.

The on-board system 100 can provide the point cloud output 152 generated by the point cloud processing system 150 to one or more other on-board systems of the vehicle 102, e.g., the planning system 160 and/or a user interface system 165.

When the planning system 160 receives the point cloud output 152, the planning system 160 can use the point cloud output 152 to generate planning decisions that plan a future trajectory of the vehicle, i.e., to generate a new planned vehicle path.

For example, the planning system 160 can use the point cloud output 152 of the point cloud processing task to make planning decisions to plan a future trajectory of the vehicle, e.g., by generating or modifying the future trajectory to avoid collisions with any detected objects or with the potential future trajectories of detected objects.

For example, the point cloud output 152 can contain a prediction that one or more points on a given object in the environment have a velocity that will cause the given object to intersect with a currently planned path for the vehicle 102, potentially causing a collision. In this example, the planning system 160 can generate a new planned vehicle path that avoids the potential collision and cause the vehicle 102 to follow the new planned path, e.g., by autonomously controlling the steering of the vehicle. As another example, the planning system 160 can use the point cloud output 152 to perform one or more downstream tasks, e.g., object tracking, trajectory prediction, and so on, and then use the outputs of these downstream tasks to generate or update the planned vehicle path.

When the user interface system 165 receives the point cloud output 152, the user interface system 165 can use the point cloud output 152 to present information to the driver of the vehicle 102 to assist the driver in operating the vehicle 102 safely. The user interface system 165 can present information to the driver of the vehicle 102 by any appropriate means, for example, by an audio message transmitted through a speaker system of the vehicle 102 or by alerts displayed on a visual display system in the agent (e.g., an LCD display on the dashboard of the vehicle 102). In a particular example, the point cloud output 152 may contain a prediction that indicates that a particular object will interest the current path of the vehicle 102, potentially causing a collision. In this example, the user interface system 165 can present an alert message to the driver of the vehicle 102 with instructions to adjust the trajectory of the vehicle 102 to avoid a collision or notifying the driver of the vehicle 102 that a collision with the particular surrounding agent is likely.

The point cloud processing system 150 includes multiple neural networks for generating the point cloud output 152. In particular, the point cloud processing system 150 uses multiple SWFormer neural network blocks to process a voxel grid of the point clouds 132, as described in further detail with reference to FIGS. 2 and 3.

Prior to using the multiple neural networks to perform a particular point cloud processing task, the point cloud processing system 150 can obtain trained parameter values 195, i.e., the trained parameter values of the multiple neural networks used by the point cloud processing system 150, from a network parameters store 190 in the training system 120.

The training system 120 is typically hosted within a data center 124, which can be a distributed computing system having hundreds or thousands of computers in one or more locations.

The training system 120 receives training data 155, such as point clouds, from vehicles operating in the real world and/or from other sources, e.g., synthetic training examples generated in simulation or training examples, such as videos, generated by sensors on other agents, e.g., robots or other moving agents. For example, the training system 120 can receive training data 155 from the vehicle 102 and one or more other agents that are in communication with the training system 120.

The training data 155 can be processed by the training system 120 to generate a new training example 175 that includes a set of point clouds and a ground truth output for the point cloud processing task.

The training data store 170 provides training examples 175 to a training engine 180, also hosted in the training system 120.

The training engine 180 uses the training examples 175 to update the parameters of the neural networks, and provides the updated network parameters 185 to the network parameters store 190.

The training engine 180 trains the multiple neural networks on the training examples 175 to minimize one or more loss functions that are appropriate for the point cloud processing task. Examples of loss functions for point cloud processing tasks are described in more detail below.

Once the parameter values of the multiple neural networks have been fully trained, the training system 120 can send the trained parameter values 195 to the point cloud processing system 150, e.g., through a wired or wireless connection.

While this specification describes that the point cloud output 152 is generated on-board an autonomous vehicle, more generally, the described techniques can be implemented on any system of one or more computers that receives point clouds of scenes in an environment. That is, once the training system 120 has trained the neural networks used by the point cloud processing system 150, the trained neural networks can be used by any system of one or more computers.

As one example, the point cloud output 152 can be generated on-board a different type of agent that has a lidar sensor and that interacts with objects as it navigates through an environment. For example, the point cloud output 152 can be generated by one or more computers embedded within a robot or other agent.

As another example, the point cloud output 152 can be generated by one or more computers that are remote from the agent and that receive images captured by one or more camera sensors of the agent. In some of these examples, the one or more computers can use the point cloud output 152 to generate control decisions for controlling the agent and then provide the control decisions to the agent for execution by the agent.

Figure 2:
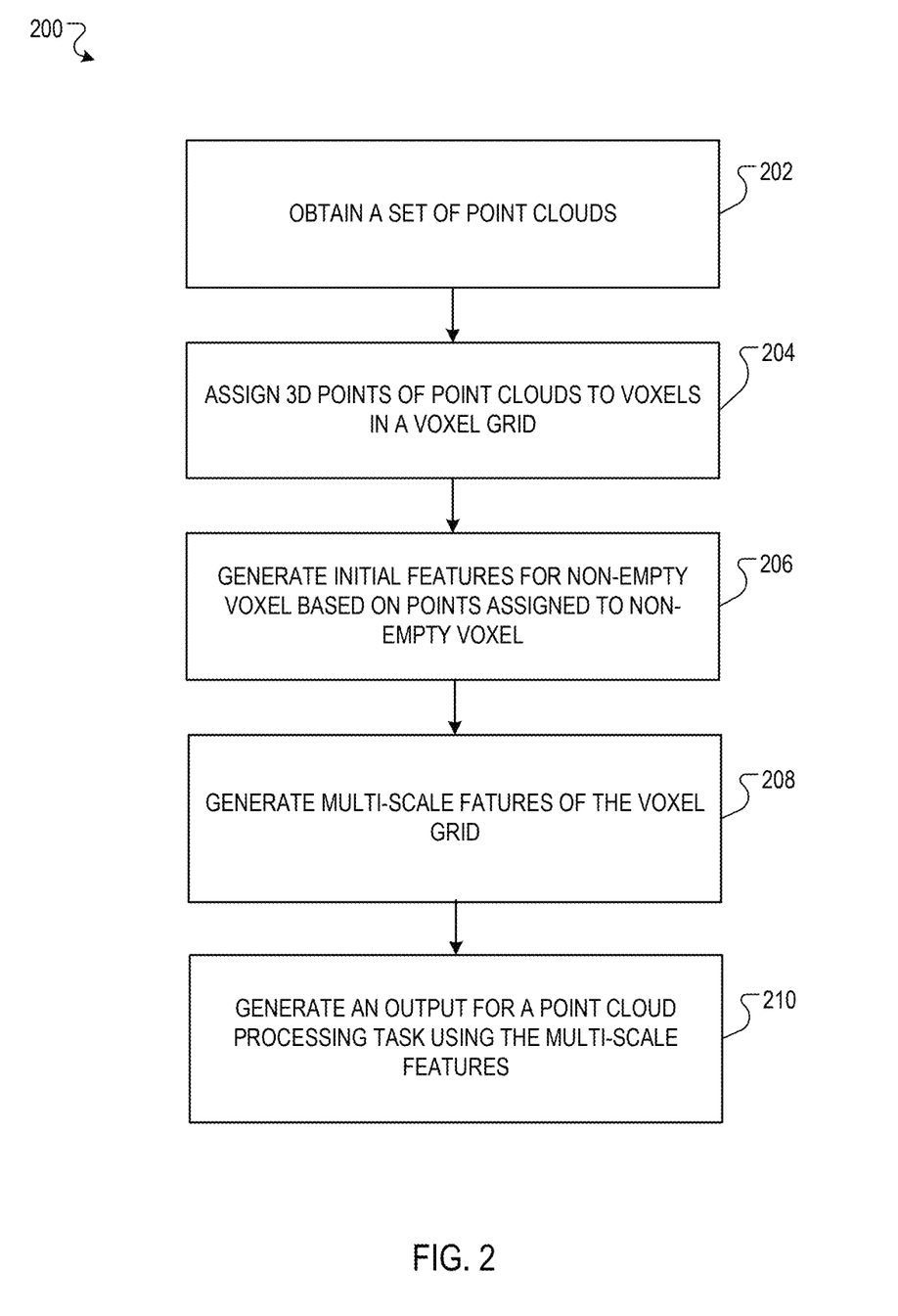
FIG. 2 is a flow diagram of an example process for processing point clouds using neural networks to perform a machine learning task.

FIG. 2 is a flow diagram of an example process 200 for processing point clouds to generate an output for a point cloud processing task. For convenience, the process 200 will be described as being performed by a system of one or more computers located in one or more locations. For example, a system, e.g., the system 100 of FIG. 1, appropriately programmed in accordance with this specification, can perform the process 200.

The system obtains a set of point clouds (202). The set of point clouds are captured by one or more sensors, and each point cloud includes multiple 3D points. The multiple 3D points are a representation of a scene in the environment.

The system assigns the 3D points of each point cloud to respective voxels in an original voxel grid (204). Because the 3D points are generally sparsely located within the environment, the original voxel grid will generally include empty voxels and non-empty voxels. The non-empty voxels are associated with (e.g., are assigned) one or more points. The empty voxels are not associated with (e.g., are not assigned) any points. For example, the system can assign the 3d points to voxels in the original voxel grid using dynamic voxelization or using another voxelization technique.

For each non-empty voxel, the system generates initial features based on the points assigned to the non-empty voxel (206). For example, the system can generate the initial features for any given non-empty voxel by processing features for each of the three-dimensional points assigned to the non-empty voxel using a feature embedding neural network (e.g., a SWFormer neural network) to generate the initial features for the voxel. For example, the features for a given point can include the coordinates of the point and optionally other features, e.g., intensity, elongation, second return, and so on. The features can also include additional features, e.g., an identifier for the point cloud to which the point belongs, pre-frame voxel features for the voxel to which the given point is assigned, and so on.

The system then generates multi-scale features of the voxel grid by processing the initial features of the non-empty voxels (208).

The multi-scale features include, for each of multiple scales, respective features for each non-empty voxel in a scaled voxel grid corresponding to the scale. The scale of a given voxel grid refers to the size of the region corresponding to each voxel in the scaled voxel grid. That is, voxel grids with a smaller scale have voxels that each cover a small region while voxel grids with larger scale have voxels that cover a larger region. More specifically, the scale of a given scaled voxel grid can be expressed with reference to the original voxel grid, i.e., so that the scale of a given scaled voxel grid is defined by how many original voxels in the original voxel grid are covered by each voxel in the scaled voxel grid. Thus, a voxel grid with a scale equal to one has the same scale as the original voxel grid, i.e., such that each voxel in the voxel grid corresponds to one of the original voxels, and a voxel grid with a scale equal to four has voxels that each cover a 4×4=16 region of original voxels in the original voxel grid.

For each scale, the system obtains initial features for each non-empty voxel in the scaled voxel grid corresponding to the scale.

Additionally, the system processes the initial features for the non-empty voxels in the scaled voxel grid corresponding to the scale using a self-attention neural network block. The self-attention neural network block generates the respective features for the non-empty voxels by processing the initial features of the non-empty voxels.

The system then fuses each of the respective features for the non-empty voxels of each scale to generate the multi-scale features.

Generating the multi-scale features is described below with reference to FIGS. 3-5.

The system then generates an output for a point cloud processing task using the multi-scale features of the voxel grid (510). For example, the system can process the features at one or more of the scales using a decoder neural network for the processing task to generate the output. Generating the output is described in more detail below.

Figure 3:
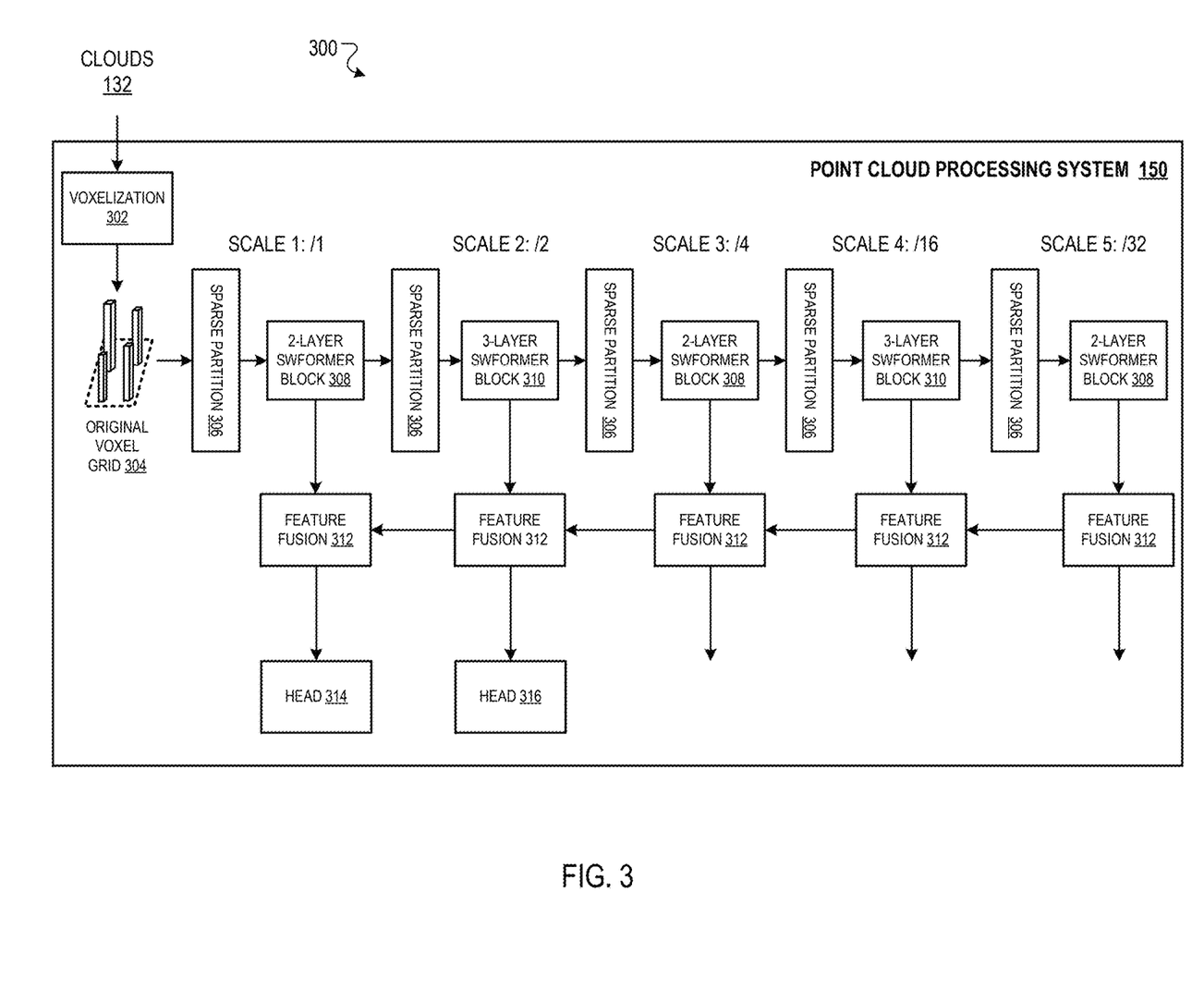
FIG. 3 is a block diagram of the point cloud processing system.

FIG. 3 shows a block diagram of the point cloud processing system 150.

As described above, the point cloud processing system 150 can process the point clouds 132 in order to generate a point cloud output for a point cloud processing task.

In particular, the point cloud processing system 150 processes the point clouds 132 to generate multi-scale features of a voxel grid. The point cloud processing system 150 can generate the point cloud output by processing the multi-scale features.

The point cloud processing system 150 converts the points of the point cloud 132 to voxels of an original voxel grid 304 by performing voxelization 302. The point cloud processing system 150 performs voxelization 302 on the point clouds 132 (e.g., the sparse point cloud) to generate a grid of 2D voxels (e.g., an original voxel grid 304).

Each point of the point cloud 132 is assigned to a voxel and, as a result, the original voxel grid 304 includes non-empty voxels and empty voxels. The non-empty voxels are voxels to which the point cloud processing system 150 assigned one or more points, and the empty voxels are voxels to which the point cloud processing system did not assign points.

The point cloud processing system 150 then processes the original voxel grid 304 to generate features for each scale of multiple scales.

At a high-level, the point cloud processing system 150 generates a scaled voxel grid 204 for each scale (e.g., scale 1, scale 2, scale 3, etc.) and generates multi-scale features for each scale that include features of the non-empty voxels of the scaled voxel grid at that scale. The scale of the original voxel grid 304 refers to the size of the region corresponding to each voxel in the original voxel grid 304. That is, voxel grids with a smaller scale have voxels that each cover a small region while voxel grids with larger scale have voxels that cover a larger region.

In the example of FIG. 2, the multiple scales include a first scale (e.g., scale 1) that is the same as, i.e., that corresponds to, the scale of the original voxel grid 304. In this example, the corresponding scaled voxel grid for the first scale (e.g., scale 1) is the original voxel grid 304. The multiple scales also include multiple scales that are larger than the scale of the original voxel grid 304, e.g., scales 2, 3, 4, and 5. For example, for scale 2, each voxel in the scaled voxel grid covers a 2×2 region of voxels of the original voxel grid 304, while for scale 5, each voxel in the scaled voxel grid covers a 32×32 region of voxels of the original voxel grid 304.

To generate the features for a given scale, the system obtains initial features for each non-empty voxel of the scaled voxel grid by performing a sparse partition 306 and then processes the initial features of the non-empty voxels using an SWFormer network block, where the SWFormer network block is a collection of hierarchical self-attention layer blocks to generate updated features.

For the first scale (e.g., scale 1), the point cloud processing system 150 performs a sparse partition 306 of the original voxel grid 304 to generate a scaled voxel grid representing initial features of the original voxel grid 304, and the point cloud processing system 150 processes the scaled voxel grid to update the features using an SWFormer block. In this example, the scaled voxel grid is the original voxel grid 304 (e.g., the same as the original voxel grid 304). The point cloud processing system 150 then updates the initial features using the 2-layer SWFormer block 308 by processing the scaled voxel grid.

For each subsequent scale, the point cloud processing system 150 performs a sparse partition 306 of the preceding scaled voxel grid to generate the scaled voxel grid, and the point cloud processing system 150 processes the scaled voxel grid to generate updated features by using the initial features generated by the preceding SWFormer block.

For example, for scale 2, the point cloud processing system 150 generates updated features using the 3-layer SWFormer block 310 by processing the scaled voxel grid representing the initial features generated by performing the sparse partition 306 of the original voxel grid 304. In this example, the initial features for the non-empty voxels in the corresponding scaled voxel for the first scale (e.g., scale 1) are the initial features for the non-empty voxels in the voxel grid 204.

In this particular example, each voxel grid is processed at each scale with corresponding strides to perform each sparse partition 306. Each of the scales correspond to a stride (e.g., 1, 2, 4, 16, and 32). The strides represent the step size of performing the sparse partition 306 on the respective voxel grid.

The operations performed to generate the features for a given scale are described in more detail below with reference to FIG. 4.

In some implementations, the point cloud processing system 150 then performs feature fusion 212 with a multi-scale feature fusion network to generate the multi-scale features. Feature fusion 212 includes fusing each of the updated features generated by the multiple SWFormer blocks for each scale, as described in further detail with reference to FIG. 4.

The point cloud processing system 150 can then send the fused multi-scale features to a decoder neural network head, such as a head 314 or a head 316. The decoder neural network head is an output unit of the point cloud processing system 150 that is specific for a point cloud processing task.

For example, the head 314 can be used for object detection, as described in further detail below with reference to FIG. 5.

Figure 4:
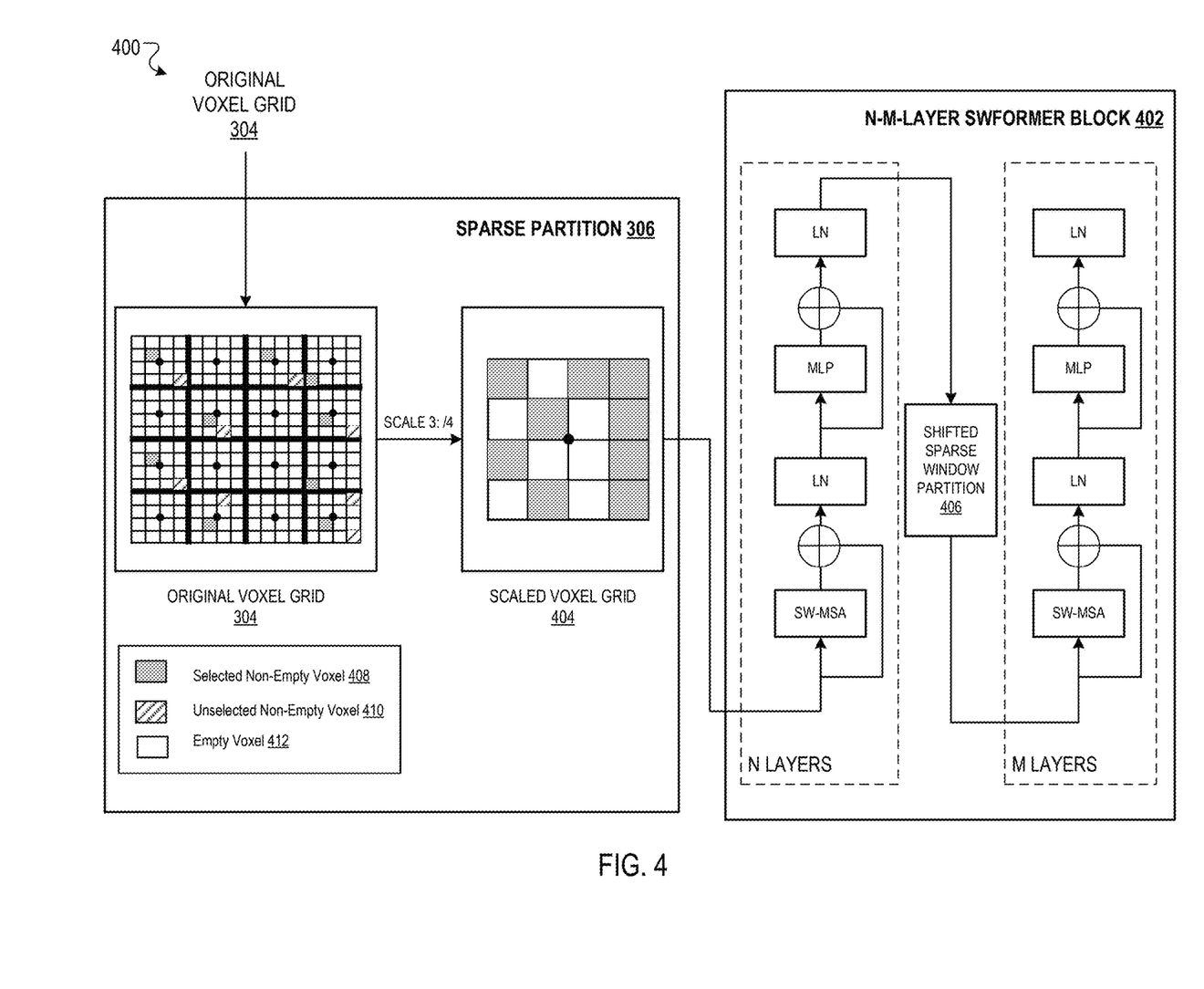
FIG. 4 is a block diagram of the sparse partition block and the SWFormer block for each scale.

FIG. 4 shows a block diagram of the sparse partition block and the SWFormer block for a given scale.

The system performs a sparse partition 306 of an input voxel grid 404 to generate a scaled voxel grid 406 that represents the initial features of the input voxel grid 404, and the system uses an SWFormer block (e.g., n-m-layer SWFormer block 402) to update the features by performing a shifted sparse window partition 406 of the scaled voxel grid 406.

For each scale, the system performs a sparse partition 306 of the input voxel grid 404 to generate the scaled voxel grid 406. In some examples, such as for the first scale, the input voxel grid 404 can be the original voxel grid 304 of scale 1 (e.g., prior to performing any scaling). In some other examples, such as for each subsequent scale, the input voxel grid 404 can be a scaled voxel grid for a preceding scale. For example, if the system is performing a sparse partition 306 corresponding to scale 3, the input voxel grid 404 can be the scaled voxel grid 406 corresponding to scale 2.

The scaled voxel grid 406 includes a sparse representation of the initial features of the input voxel grid 404. The system performs the sparse partition 306 by scaling the input voxel grid 404 based on the respective scale.

In particular, to perform the sparse partition 306 of the input voxel grid 404, the system divides the voxels of the input voxel grid 404 into multiple non-overlapping regions based on the scale, so that each voxel in the scaled voxel grid 404 corresponds to one of the non-overlapping regions.

The multiple regions each cover a certain square section of the input voxel grid 404, where the size of the region is determined by the scale. For example, scale 3 corresponds to 4×4 regions of the voxels in the input voxel grid 404. Each window can include non-empty voxels (e.g., selected non-empty voxels 408 and unselected non-empty voxels 410), empty voxels 412, or both.

For each region with at least one non-empty voxel, the system identifies and selects a non-empty voxel within the region that is closest to the center of the region (e.g., selected non-empty voxel 408). The system then assigns the initial features of the voxel in the scaled voxel grid 404 corresponding to the region based on the selected non-empty voxel 408 of the input voxel grid 404, e.g., by setting the initial features equal to the features of the selected non-empty voxel 408. The system refrains from using the initial features for non-empty voxels that are further from the center of the region than the selected voxel, which are referred to as unselected non-empty voxels 410.

For regions with only empty voxels 412, the system does not assign features to the regions.

For example, for scale 3 with stride 4, the system partitions the input voxel grid 404 into a grid of regions of 4×4 voxels, where each region corresponds to a voxel of the scaled voxel grid 406. For each region of the input voxel grid 404 that contains non-empty voxels 408, the system selects a non-empty voxel, and the system assigns the features of the selected non-empty voxel 408 to the corresponding voxel of the scaled voxel grid 406.

The system then divides the scaled voxel grid 404 into window and processes each window of the scaled voxel grid 404 to generate and update the features for each voxel using an n-m-layer SWFormer block 402. The system converts each region of the scaled voxel grid 404 into an input sequence of elements representing the scaled voxel grid 404. Each element of the input sequence corresponds to the features of a non-empty voxel in the window of the scaled voxel grid 404. Additionally, each window of the scaled voxel grid 404 is processed separately using N layers of an n-m-layer SWFormer block 402.

The n-m-layer SWFormer block 402 is a Transformer neural network with a certain amount of layers, such as a 2-layer SWFormer block or a 3-layer SWFormer block. The n-m-layer SWFormer block 402 uses a self-attention mechanism to process different positions of the input sequence. Each n-m-layer SWFormer block 402 has N+M Transformer layers, but only one shifted sparse window partition 406, which increases the efficiency of the overall system.

For each window of the scaled voxel grid 404 (e.g., for each window with non-empty voxels in the scaled voxel grid 404), the n-m-layer SWFormer block 402 processes the features of the non-empty voxels within the window to generate respective updated features for the non-empty voxels in the window.

The set of Equations 1 shows the self-attention mechanism of the n-m-layer SWFormer block 402 for processing the non-empty voxels of each window:

$$z^0 = [x; mask_z] + PE_z$$

$$\hat{z}^l = LN(z^{l-1} + SW\text{-}MSA(z^{l-1}))$$

$$z^l = LN(\hat{z}^l + MLP(\hat{z}^l)) \quad (1)$$

where $z^0$ is an initial representation of the input sequence x, x represents the input sequence of initial features of the non-empty voxels for a given window, $mask_z$ represents a mask for input padding of the input sequence, and $PE_z$ is a positional encoding.

The n-m-layer SWFormer block 402 includes a number (N) of Transformer layers that correspond to a certain number of update iterations l, where the update iterations l ranges from 1 to N.

The n-m-layer SWFormer block 402 applies the N Transformer layers to the initial representation of the input sequence $z^0$ and to generate an output sequence of features $z^N$, where $z^N$ is the updated output sequence after processing the initial representation $z^0$ for N update iterations. $z^N$ represents the updated features of the non-empty voxels.

Each Transformer layer includes updating the sequence by applying a multi-head self-attention (SW-MSA) procedure to the preceding updated sequence $z^{l-1}$. The n-m-layer SWFormer block 402 then applies a layer normalization (LN) block to the updated sequence to normalize each of the values in the sequence.

The Transformer layer also applies a multilayer perceptron (MLP) to the updated sequence $\hat{z}^l$. The n-m-layer SWFormer block 402 also applies an LN block to the updated sequence after applying the MLP to generate the output sequence of features $z^N$.

After the N'th Transformer layer, the n-m-layer SWFormer block 402 then performs a shifted sparse window partition 406 on the output sequence $z^N$ representing the updated features corresponding to the non-empty voxels of the scaled voxel grid 404.

The n-m-layer SWFormer block 402 partitions the multiple windows of the scaled voxel grid 404 into multiple shifted windows, where the multiple shifted windows are different than the original multiple widows of the scaled voxel grid 404.

For each shifted window, the n-m-layer SWFormer block 402 identifies whether the window has non-empty voxels. If the window has non-empty voxels, the n-m-layer SWFormer block 402 processes a sequence of the updated features $z^N$ corresponding to the non-empty voxels of the shifted window using a number (M) of Transformer layers to generate the features of the shifted window, as shown by the set of Equations 2.

$$u^0 = [\text{shift-window}(z^N; \text{mask}_u] + PE_u$$

$$\hat{u}^l = LN(u^{l-1} + SW\text{-}MSA(u^{l-1}))$$

$$u^l = LN(\hat{u}^l + MLP(\hat{u}^l)) \qquad (2)$$

where $u^0$ is an initial representation of the shifted updated sequence, $z^N$ represents the output sequence generated by the N Transformer layers, $\text{mask}_u$ represents the mask for input padding of the input sequence, and $PE_u$ is the positional encoding.

The n-m-layer SWFormer block 402 includes M Transformer layers that correspond to a certain number of update iterations l, where the update iterations l ranges from 1 to M.

The n-m-layer SWFormer block 402 applies the M Transformer layers to the initial representation of the shifted updated sequence $u^0$ and to an output sequence of features $u^M$, where $u^M$ is the updated shifted output sequence representing the updated features of the non-empty voxels in the shifted windows.

Each Transformer layer includes updating the sequence by applying the SW-MSA procedure to the preceding updated sequence $u^{l-1}$. The n-m-layer SWFormer block 402 then applies an LN block to the updated sequence.

The Transformer layer also includes applying an MLP to the updated sequence $\hat{u}^l$. The n-m-layer SWFormer block 402 then applies an LN block to the updated sequence after applying the MLP to generate the output sequence of features $u^M$.

As described above, in some implementations, the system then fuses the multi-scale features to generate fused features for a point cloud processing task.

Figure 5:
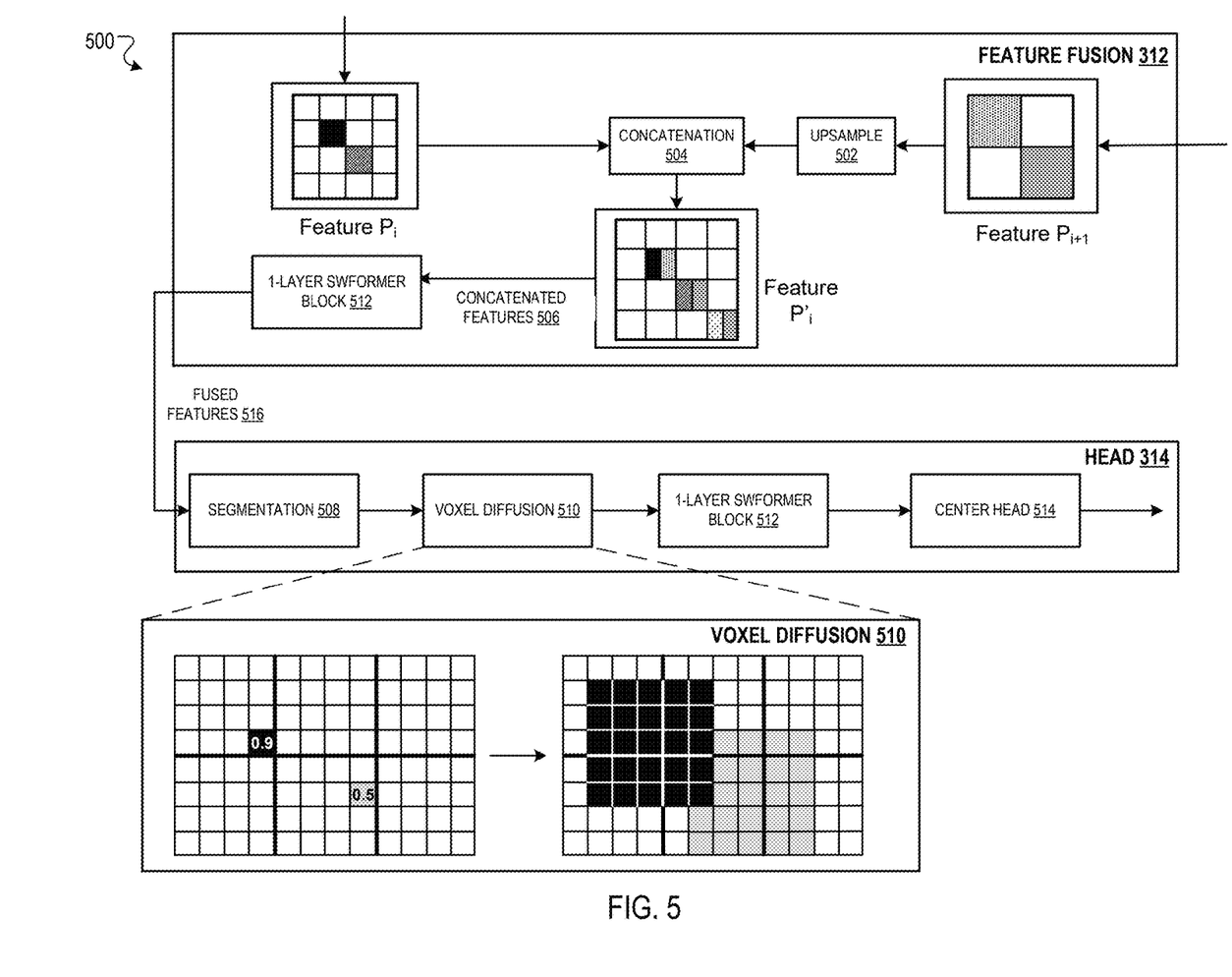
FIG. 5 is a block diagram of feature fusion.

FIG. 5 shows a block diagram of feature fusion.

After processing and updating the multi-scale features of the non-empty voxels using each of the hierarchical SWFormer blocks, the system performs feature fusion 312 to generate the fused features 516 that include respective fused features 516 for each of the multiple scales.

To generate the fused features for a given scale, the system generates respective concatenated features 506 for each feature of the multi-scale features corresponding to each non-empty voxel of the scaled voxel grid having the scale. The concatenated features 506 are features of non-empty voxels corresponding to different scales.

The system iteratively fuses a first output sequence of features generated by a first SWFormer block corresponding to a first scale with a second output sequence of features generated by a second SWFormer block corresponding to a second scale by performing upsampling and concatenation. In particular, the system iteratively fuses each feature ($P_i$) with a preceding feature ($P_{i+1}$) to generate the multi-scale feature ($P_i'$).

Each feature is associated with a stride. The system iteratively fuses the s features from a large stride to a small stride. For example, the system fuses the feature with a stride of 32 to a feature with a stride of 16. Thus, the respective fused features 416 for a largest scale (e.g., scale 5 corresponding to a stride of 32) are the respective features for the largest scale.

In particular, starting from $P_{i+1}$ corresponding to the largest stride (e.g., $P_5$ corresponding to a stride of 32), the system performs an upsampling procedure 502 of $P_{i+1}$. The system upscales the scaled voxel grid associated with the feature $P_{i+1}$ by assigned the non-empty voxels of the scaled voxel grid to an upscaled voxel grid. Thus, by assigning the non-empty voxels to the upscaled voxel grid, the system upsamples $P_{i+1}$ to generate an upsampled version of $P_{i+1}$ that has the same stride as same stride as $P_i$ (e.g., a same stride of 16 corresponding to $P_4$).

Because the two features ($P_{i+1}$ and $P_i$) have the same stride, the system can concatenate 504 the upsampled version of $P_{i+1}$ and $P_i$ to generate the concatenated feature 506 $P_i'$.

The system then processes each of the concatenated features 506 for each of the non-empty voxels using a 1-layer SWFormer block 512 to generate the fused features 516. The 1-layer SWFormer block 512 applies self-attention to the concatenated features 506.

The system can then use the fused features 516 for one or more of the scales to perform a point cloud processing task by processing the fused features 516 for a given scale with a head 214. The point cloud processing task can be object detection, semantic segmentation, or another point cloud processing task.

For example, the head 214 shows an example head for object detection. The system can identify one or more 3D bounding boxes or other 3D regions within the voxel grid that are each measurements of a different object and, optionally, can identify an object class or object identifier for the object corresponding to each region.

In particular, the system sends the fused features 516 to the head 214. The system processes the fused features 516 for object detection by performing segmentation 508 and voxel diffusion 510.

The system can perform segmentation 508 by segmenting the voxels of a scaled voxel grid into foreground voxels and background voxels. The scaled voxel grid can correspond to the smallest scale (e.g., scale 1). The system filters out the background voxels, and the system uses the foreground voxels to perform voxel diffusion 510. The system assigns a segmentation score to each of the foreground voxels (e.g., a segmentation score of 0.9 or 0.5).

The system performs voxel diffusion by generating a diffused feature from the fused feature 516 for each voxel in the scaled voxel grid. The system diffuses (e.g., expands) each voxel with a segmentation score greater than a certain threshold (e.g., 0.05) to generate the diffused features. In particular, the system expands each voxel by initializing the features of the voxel into neighboring voxels of the scaled voxel grid using a head-specific diffusion factor. The head-specific diffusion factor is specific to the head 314 and controls the magnitude of the expansion of the voxel. Thus, the system can generate sparse features by filtering out the background voxels through segmentation 508 and expanding the foreground voxels using voxel diffusion 510.

The system then uses a decoder neural network to generate a point cloud output. In this example, the decoder includes a 1-layer SWFormer block 512 corresponding to a center head 414 for object detection to generate 3D boxes from the fused features. The system can assign object classes to the generated 3D boxes as part of object detection. Different object classes (e.g., vehicles and pedestrians) may use a separate head for different scales.

The system then performs box regression to generate 3D boxes from the voxel features by using a center head neural network 514. The system performs box regression by regressing 3D boxes from features of the voxels, and the system can perform object detection by assigning one or more object classes to the 3D boxes based on the features of the 3D boxes.

The system jointly trains the point processing neural network to perform segmentation 508 and object detection. In particular, for each voxel, the system assigns a binary ground truth label for background voxels and foreground voxels (e.g., 0 for background voxels and 1 for foreground voxels).

The system determines whether the voxel is a foreground voxel, or a background voxel based on whether the voxel overlaps with any objects. If the voxel does not overlap with any objects, the system labels the voxel as a background voxel. If the voxel overlaps with at least one objects, the system labels the voxel as a foreground voxel. The system trains the neural network to perform segmentation using the ground truth labels with a two-class focal loss, as shown by Equation 3:

$$L_{seg}^c = \frac{1}{N} \sum_i L_i \qquad (3)$$

where $L_{seg}^c$ is the segmentation loss for each object class (c), N is the total number of non-empty voxels, and $L_i$ is the focal loss for each voxel (i). At inference time, the system determines whether voxels are foreground voxels based on the segmentation score, as described above.

The system trains the decoder head neural network (e.g., the head 314) to perform object detection using a total loss function, as shown by Equation 4:

$$L = \sum_c \left( \lambda_1 L_{seg}^c + \lambda_2 L_{hm}^c + L_{box}^c \right) \qquad (4)$$

where L is the total loss associated with performing object detection using the head 314, $\lambda_1 L_{seg}^c$ is the two-focal loss of each object class, as shown by Equation 3, $\lambda_2 L_{hm}^c$ is the heatmap loss for each object class, and $L_{box}^c$ is the loss associated with performing box regression. The heatmap loss is associated with filtering the voxels of the voxel grid using a heat map, where the point cloud processing system labels voxels below a certain threshold as empty voxels.

The point cloud processing system can backpropagate the total loss to train the SWFormer blocks for generating the multi-scale features and the fused features.

In some other examples, the head 214 can also be an example head for performing semantic segmentation.

For each point of a point cloud, the system can obtain an initial feature associated with the point (e.g., per-point feature). For a selected scale, the system can obtain the fused features 516 generated by the point cloud processing system. The system can obtain per-voxel features (e.g., a per-voxel SWFormer feature) from the fused features 516 corresponding to each voxel of the scaled voxel grid, and the system can identify the per-voxel feature of a voxel that corresponds to the respective point.

For each point, the system can concatenate the per-point feature and the corresponding per-voxel feature, and the system can use the concatenation of the features to perform segmentation labeling for each point by predicting the segmentation label of the point based on the concatenated features, e.g., by processing the concatenated feature through an MLP. Additionally, the system can predict segmentation labels for objects identified from object detection.

This specification uses the term "configured" in connection with systems and computer program components. For a system of one or more computers to be configured to perform particular operations or actions means that the system has installed on IT software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

In this specification the term "engine" is used broadly to refer to a software-based system, subsystem, or process that is programmed to perform one or more specific functions. Generally, an engine will be implemented as one or more software modules or components, installed on one or more computers in one or more locations. In some cases, one or more computers will be dedicated to a particular engine; in other cases, multiple engines can be installed and running on the same computer or computers.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone that is running a messaging application, and receiving responsive messages from the user in return.

Data processing apparatus for implementing machine learning models can also include, for example, special-purpose hardware accelerator units for processing common and compute-intensive parts of machine learning training or production, i.e., inference, workloads.

Machine learning models can be implemented and deployed using a machine learning framework, e.g., a TensorFlow framework.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method performed by one or more computers, the method comprising:
    obtaining a set of point clouds captured by one or more sensors, wherein each point cloud comprises a respective plurality of three-dimensional points;
    assigning the three-dimensional points to respective voxels in a voxel grid of voxels;
    generating multi-scale features of the voxel grid, the multi-scale features comprising, for each of a plurality of scales, respective features for each non-empty voxel in a scaled voxel grid corresponding to the scale, the generating comprising:
        processing respective features for each non-empty voxel in the voxel grid through a hierarchical sequence of self-attention neural network blocks, the processing comprising, for each scale:
            obtaining initial features for each non-empty voxel in the scaled voxel grid corresponding to the scale; and
            processing the initial features for the non-empty voxels in the scaled voxel grid corresponding to the scale using a self-attention neural network to generate the respective features for the non-empty voxels in the scaled voxel grid corresponding to the scale; and
    generating an output for a point cloud processing task using the multi-scale features of the voxel grid.

2. The method of claim 1, wherein the non-empty voxels are respective voxels to which one or more points are assigned and empty voxels are respective voxels to which no points are assigned.

3. The method of claim 2, further comprising:
    for each non-empty voxel, generating initial features for the non-empty voxel based on the points that are assigned to the non-empty voxel.

4. The method of claim 3, wherein processing the initial features for the non-empty voxels in the scaled voxel grid corresponding to the scale using a self-attention neural network block to generate the respective features for the non-empty voxels in the scaled voxel grid corresponding to the scale comprises:
    partitioning the scaled voxel grid into a plurality of windows;
    for each window that has non-empty voxels;
        processing the initial features of the non-empty voxels in the window using one or more Transformers layers that each apply self-attention only over the non-empty voxels in the window to generate respective updated features for the non-empty voxels in the window;
    partitioning the scaled voxel grid into a plurality of shifted windows that are different from the plurality of windows; and
    for each shifted window that has non-empty voxels:
        processing the updated features of the non-empty voxels in the shifted window using one or more Transformers layers that each apply self-attention only over the non-empty voxels in the shifted window to generate the respective features for the non-empty voxels in the shifted window.

5. The method of claim 3, wherein, for each scale, each voxel in the scaled voxel grid corresponding to the scale corresponds to a respective region in the voxel grid having a size corresponding to the scale.

6. The method of claim 5, wherein:
    the plurality of scales comprise a first scale that is equal to a scale of the voxel,
    the corresponding scaled voxel grid for the first scale is the voxel grid, and
    the initial features for the non-empty voxels in the corresponding scaled voxel for the first scale are the initial features for the non-empty voxels in the voxel grid.

7. The method of claim 3, wherein obtaining initial features for each non-empty voxel in the scaled voxel grid corresponding to the scale comprises:
    for each non-empty voxel in the scaled voxel grid corresponding to the scale, identifying a non-empty voxel in the voxel grid that is closest to a center of the respective region in the voxel grid corresponding to the voxel; and
    generating the initial features for the voxel based on the identified non-empty voxel.

8. The method of claim 7, wherein generating the initial features for the voxel based on the identified non-empty voxel comprises:
    for each scale other than the first scale,
    identifying a preceding non-empty voxel in a scaled voxel grid corresponding to a smaller scale having a corresponding region that includes the identified non-empty voxel; and
    setting the initial features for the voxel equal to the features for the identified preceding non-empty voxel.

9. The method of claim 1, wherein generating an output for a point cloud processing task using the multi-scale features of the voxel grid comprises:
    for each scale, generating respective fused features for each non-empty voxel in the scaled voxel grid for the scale from the multi-scale features; and
    generating the output for the point cloud processing task from the fused features.

10. The method of claim 9, wherein the respective fused features for a largest scale are the respective features for the largest scale.

11. The method of claim 10, wherein for each scale other than the largest scale, generating respective fused features for each non-empty voxel in the scaled voxel grid for the scale comprises:
    generating a concatenated feature for each non-empty voxel in the scaled voxel grid for the scale from the features for the non-empty voxel and fused features for a corresponding voxel in an upscaled voxel grid generated from a scaled voxel grid having a higher scale; and
    processing the concatenated features for the non-empty voxels in the scaled voxel grid using a self-attention neural network block.

12. The method of claim 9, wherein:
    generating the output for the point cloud processing task comprises:
        applying voxel diffusion to at least the fused features for the smallest scale to generate a diffused feature for each voxel in the voxel grid; and
        processing the diffused features using a decoder neural network to generate the output for the point cloud processing task.

13. The method of claim 1, wherein the point cloud processing task is object detection.

14. The method of claim 1, wherein the point cloud processing task is semantic segmentation.

15. A system comprising:
one or more computers; and
one or more storage devices storing instructions that, when executed by the one or more computers, cause the one or more computers to perform operations comprising:
obtaining a set of point clouds captured by one or more sensors, wherein each point cloud comprises a respective plurality of three-dimensional points;
assigning the three-dimensional points to respective voxels in a voxel grid of voxels;
generating multi-scale features of the voxel grid, the multi-scale features comprising, for each of a plurality of scales, respective features for each non-empty voxel in a scaled voxel grid corresponding to the scale, the generating comprising:
processing respective features for each non-empty voxel in the voxel grid through a hierarchical sequence of self-attention neural network blocks, the processing comprising, for each scale:
obtaining initial features for each non-empty voxel in the scaled voxel grid corresponding to the scale; and
processing the initial features for the non-empty voxels in the scaled voxel grid corresponding to the scale using a self-attention neural network to generate the respective features for the non-empty voxels in the scaled voxel grid corresponding to the scale; and
generating an output for a point cloud processing task using the multi-scale features of the voxel grid.

16. The system of claim 15, wherein the non-empty voxels are respective voxels to which one or more points are assigned and empty voxels are respective voxels to which no points are assigned.

17. The system of claim 16, further comprising:
for each non-empty voxel, generating initial features for the non-empty voxel based on the points that are assigned to the non-empty voxel.

18. One or more non-transitory computer-readable storage media storing encoded with computer program instructions that when executed by one or more computers cause the one or more computers to perform operations comprising:
obtaining a set of point clouds captured by one or more sensors, wherein each point cloud comprises a respective plurality of three-dimensional points;
assigning the three-dimensional points to respective voxels in a voxel grid of voxels;
generating multi-scale features of the voxel grid, the multi-scale features comprising, for each of a plurality of scales, respective features for each non-empty voxel in a scaled voxel grid corresponding to the scale, the generating comprising:
processing respective features for each non-empty voxel in the voxel grid through a hierarchical sequence of self-attention neural network blocks, the processing comprising, for each scale:
obtaining initial features for each non-empty voxel in the scaled voxel grid corresponding to the scale; and
processing the initial features for the non-empty voxels in the scaled voxel grid corresponding to the scale using a self-attention neural network to generate the respective features for the non-empty voxels in the scaled voxel grid corresponding to the scale; and
generating an output for a point cloud processing task using the multi-scale features of the voxel grid.

19. The non-transitory computer-readable storage media of claim 18, wherein the non-empty voxels are respective voxels to which one or more points are assigned and empty voxels are respective voxels to which no points are assigned.

20. The non-transitory computer-readable storage media of claim 18, the operations further comprising:
for each non-empty voxel, generating initial features for the non-empty voxel based on the points that are assigned to the non-empty voxel.

* * * * *